(12) United States Patent
Forbes

(10) Patent No.: US 7,221,597 B2
(45) Date of Patent: May 22, 2007

(54) BALLISTIC DIRECT INJECTION FLASH MEMORY CELL ON STRAINED SILICON STRUCTURES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 10/854,396

(22) Filed: May 26, 2004

(65) Prior Publication Data

US 2005/0276117 A1 Dec. 15, 2005

(51) Int. Cl.
*G11C 16/04* (2006.01)

(52) U.S. Cl. .......................... 365/185.28; 365/185.29; 365/185.33; 257/192; 257/315

(58) Field of Classification Search .......... 365/185.28, 365/185.29, 185.27, 185.17, 185.33; 257/192, 257/314, 315, 320, 321
See application file for complete search history.

(56) References Cited

U.S. PATENT DOCUMENTS

| | | | |
|---|---|---|---|
| 5,451,800 A | 9/1995 | Mohammad | |
| 5,923,056 A | 7/1999 | Lee et al. | |
| 5,969,384 A | 10/1999 | Hong | |
| 6,204,123 B1 | 3/2001 | Mori | |
| 6,207,978 B1 | 3/2001 | Fastow | |
| 6,313,486 B1* | 11/2001 | Kencke et al. | 257/192 |
| 6,313,487 B1 | 11/2001 | Kencke et al. | |
| 6,600,170 B1* | 7/2003 | Xiang | 257/18 |
| 6,642,106 B1 | 11/2003 | Yang et al. | |
| 6,680,496 B1* | 1/2004 | Hammond et al. | 257/192 |
| 6,686,245 B1* | 2/2004 | Mathew et al. | 438/283 |
| 6,987,037 B2* | 1/2006 | Forbes | 438/197 |
| 2003/0218920 A1* | 11/2003 | Harari | 365/200 |
| 2004/0051140 A1 | 3/2004 | Bhattacharyya | |
| 2005/0162928 A1* | 7/2005 | Rosmeulen | 365/185.29 |
| 2005/0224861 A1* | 10/2005 | Lee et al. | 257/315 |

* cited by examiner

*Primary Examiner*—Gene N. Auduong
(74) *Attorney, Agent, or Firm*—Leffert Jay & Polglaze, P.A.

(57) ABSTRACT

A flash memory cell comprising a silicon-germanium layer with a pair of source/drain regions. A strained silicon layer is formed over the silicon-germanium layer such that the pair of source/drain regions is linked by a channel in the strained silicon layer. A floating gate layer is formed over the channel. The floating gate layer has at least one charge storage region. The floating gate layer may be a planar floating gate, a planar split floating gate, or a vertical split floating gate. A control gate is formed over the floating gate layer. Ballistic direct injection is used to program the memory cell. A first charge storage region of the floating gate layer establishes a virtual source/drain region in the channel. The virtual source/drain region has a lower threshold voltage than the remaining portion of the channel.

39 Claims, 3 Drawing Sheets

BALLISTIC DIRECT INJECTION FLASH MEMORY CELL ON STRAINED SILICON STRUCTURES

TECHNICAL FIELD OF THE INVENTION

The present invention relates generally to memory devices and in particular the present invention relates to flash memory cells.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions.

For the reasons stated above, and for other reasons stated below which will become apparent to those skilled in the art upon reading and understanding the present specification, there is a need in the art for a higher performance flash memory transistor.

SUMMARY

The above-mentioned problems with performance, scalability, and other problems are addressed by the present invention and will be understood by reading and studying the following specification.

The present invention encompasses a flash memory cell comprising a silicon-germanium layer with a pair of doped regions. A strained silicon layer is formed over the silicon-germanium layer such that the pair of doped regions is linked by a channel in the strained silicon layer.

A floating gate layer is formed over the channel. The floating gate layer has at least one charge storage region. A first charge storage region of the floating gate layer establishes a virtual source/drain region in the channel. The virtual source/drain region has a lower threshold voltage than the remaining portion of the channel. A control gate formed over the floating gate layer.

Further embodiments of the invention include methods and apparatus of varying scope.

DETAILED DESCRIPTION

Figure 1:
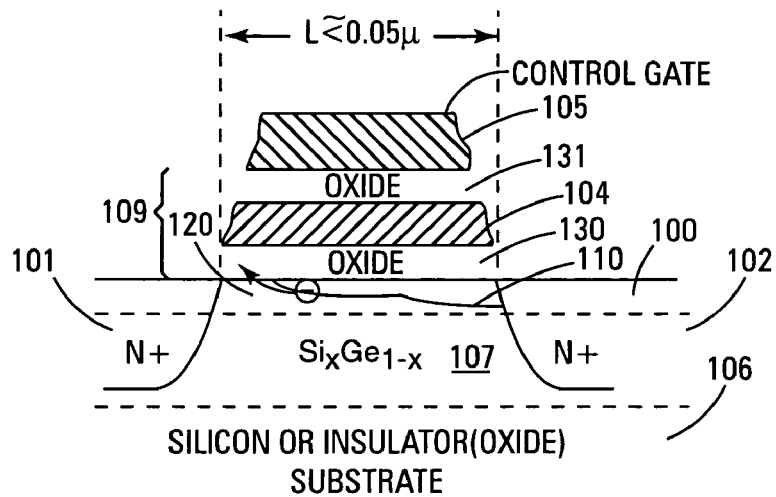
FIG. 1 shows a cross-sectional view of one embodiment of a planar, floating gate flash memory cell of the present invention using a strained silicon layer with ballistic direct injection.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of a planar flash memory cell of the present invention. The cell, in one embodiment, is comprised of a silicon or a silicon-on-insulator (oxide) substrate 106 with a silicon-germanium ($Si_xGe_{1-x}$) layer 107. Two n+ doped regions 101 and 102, acting as source/drain regions, are implanted into the $Si_xGe_{1-x}$ layer 107. The function of the region 101 or 102 is determined by the direction of operation of the memory cell.

In the embodiment of FIG. 1, the $Si_xGe_{1-x}$ layer 107 is a p-type material and the source/drain regions 101 and 102 are n-type material. However, alternate embodiments may have an n-type $Si_xGe_{1-x}$ layer with p-type source/drain regions.

A strained silicon layer 100 is formed on the $Si_xGe_{1-x}$ layer 107. Strained silicon takes advantage of the natural tendency of atoms inside compounds to align with one another. When silicon is deposited on top of a substrate with atoms spaced farther apart, the atoms in the silicon stretch to line up with the atoms beneath, thus "stretching" or "straining" the silicon. In the strained silicon, electrons experience less resistance and can flow up to 70 percent faster without having to shrink the size of the transistor.

In one embodiment, the strained silicon layer 100 is formed on the relaxed $Si_xGe_{1-x}$ layer 107 by an ultra-high vacuum chemical vapor deposition (UHVCVD) process. In another embodiment, an ion implantation process on the silicon substrate 106 is employed. The strained silicon layer 100 and $Si_xGe_{1-x}$ layer 107 may also be formed on an insulator to make silicon-on-insulator (SOI) structures. This structure may be formed by UHVCVD, ion implantation, wafer bonding, or other processes.

In additional embodiments, the strained layer 100 is formed by micromechanical stress on a thin silicon film structure on the silicon substrate 106 or by mechanical stress on a bulk silicon substrate.

A channel region 110 is formed between the source/drain regions 101 and 102 and in the strained silicon layer 100. In one embodiment, this channel 110 is an ultra-short channel length of less than approximately 50 nm in length. Alternate embodiments use other channel lengths.

A tunnel dielectric 130 is formed over the channel region 110. The tunnel dielectric 130 is generally a silicon oxide, but may be any dielectric material. Some examples include silicon oxides ($SiO/SiO_2$), silicon nitrides ($SiN/Si_2N/Si_3N_4$) and silicon oxynitrides ($SiO_xN_y$).

A polysilicon layer 104 is formed over the tunnel dielectric 130. The polysilicon layer 104 is the floating gate and may be conductively doped. An example would be an n-type polysilicon layer 104. Another oxide dielectric layer 131 is formed over the floating gate 104 and may be comprised of a substantially similar material as the tunnel dielectric layer 130. A control gate 105 is formed over the top oxide dielectric layer 131 and can be made of doped polysilicon.

In the embodiment shown in FIG. 1, the tunnel dielectric layer 130 and floating gate 104 are considered the gate insulator 109. In another embodiment, the gate insulator 109 is formed in an oxide-nitride composition 109. In alternative embodiments, the gate insulator 109 may be selected from the group of silicon dioxide ($SiO_2$) formed by wet oxidation, silicon oxynitride (SON), silicon rich oxide (SRO), and silicon rich aluminum oxide ($Al_2O_3$).

In other embodiments, the gate insulator 109 is selected from the group of silicon rich aluminum oxide insulators, silicon oxide insulators with the inclusion of silicon carbide, and silicon oxycarbide insulators. In still other embodiments, the gate insulator 109 includes a composite layer selected from the group of an oxide-aluminum oxide ($Al_2O_3$) composite layer and an oxide-silicon oxycarbide composite layer.

In still other embodiments, the gate insulator 109 includes a composite layer, or a non-stoichiometric single layer of two or more materials selected from the group of silicon (Si), titanium (Ti), and tantalum (Ta).

During a program operation of the memory cell of FIG. 1, electrons are injected from a pinched off area 120 of the channel region 110 to the floating gate 104 storage area. The electrons flow in the opposite direction during an erase operation. The memory cell of the present invention employs ballistic injection to perform a programming operation. The ballistic injection provides lower write times and currents. Ballistic injection is possible in this planar single floating gate structure if the gate length is relatively short (i.e., less than approximately 50 nm)

Figure 2:
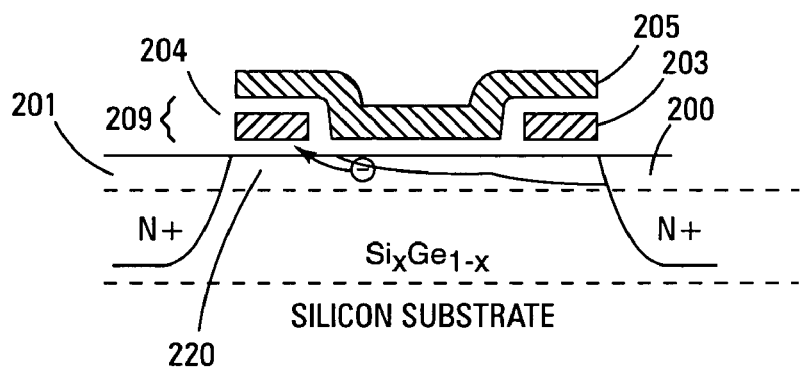
FIG. 2 shows a cross-sectional view of one embodiment of a split gate flash memory cell of the present invention using a strained silicon layer with ballistic direct injection.

FIG. 2 illustrates a cross-sectional view of one embodiment of a split floating gate transistor of the present invention. The composition of this embodiment is substantially similar to the planar embodiment of FIG. 1 including the strained silicon layer 200. However, the control gate 205 of this embodiment includes a depression portion that physically separates or "splits" the floating gate 203 and 204 such that two charge storage areas are created. In operation, the memory cell of the present invention employs ballistic direct injection to perform the programming operation.

The composition of the gate insulator layer 209 is substantially similar to the embodiment of FIG. 1. Alternate embodiments may use other compositions.

FIG. 2 illustrates the pinched off region 220 of the channel and, therefore, the virtual source/drain region, to be under the left floating gate 204. However, since this cell is symmetrical, if it is operated in the opposite direction the virtual source/drain region will occur under the right floating gate 203.

The ballistic injection in FIG. 2 is accomplished by initially over-erasing the cell. This may be done during a functional test. The over-erase operation leaves the floating gates 203 and 204 with an absence of electrons (i.e., in a positive charge state) and creates "virtual" source/drain regions near the source/drains regions 200 and 201. The virtual source/drain region 220 has a lower threshold voltage than the central part of the channel and is either an ultra thin sheet of electrons or a depleted region with a low energy or potential well for electrons.

When the transistor is turned on with an applied drain voltage, a variation in potential energy is created along the surface of the semiconductor. A potential well or minimum for electrons exists due to the positive charge on the floating gate 204. When the transistor is turned on, these potential energy minimums for electrons cause a higher density of electrons near the source and the channel pinches off further away from the drain than normal. The length of the pinched-off region 220 is determined by the length of the storage area. Hot electrons accelerated in the narrow region 220 near the drain become ballistic and are directly injected onto the floating gate 204.

In one embodiment, this pinched-off region 220 is in a range of 10–40 nm (100-400 Å). Alternate embodiments have different ranges depending on the storage region length.

The transistor of the present invention is symmetrical and can be operated in either direction, depending on the composition of the floating gate, to create two possible storage regions when operated in a virtual ground array. Therefore, the above operation description can be applied to the operation of the transistor when the remaining source/drain region is biased such that it operates as a drain region and the virtual source/drain region is on the opposite side of the channel.

Figure 3:
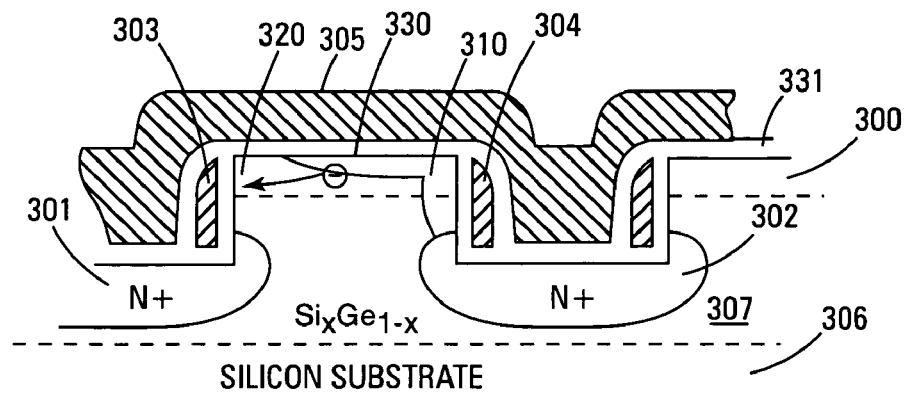
FIG. 3 shows a cross-sectional view of one embodiment of a vertical split gate flash memory using a strained silicon layer with ballistic direct injection.

FIG. 3 illustrates a cross-sectional view of one embodiment of a vertical split floating gate flash memory cell of the present invention. The transistor is comprised of a silicon substrate 306 on which a layer of $Si_xGe_{1-x}$ 307 is formed. The layer of $Si_xGe_{1-x}$ 307 includes a plurality of doped regions 301 and 302 that act as source/drain regions. In one embodiment, the substrate is a p-type material and the doped regions are n-type material. Alternate embodiments use an n-type substrate with opposite type doped regions 301 and 302.

The substrate forms a pillar 330 between two floating gate storage regions 303 and 304. This provides electrical isolation of the storage regions 303 and 304. A control gate 305 is formed over the storage regions 303 and 304 and substrate pillar 330. An oxide dielectric material 331 provides isolation between the silicon-germanium layer 307, the split floating gate 303 and 304, and the control gate 305.

The strained silicon layer 300 is formed on the $Si_xGe_{1-x}$ layer 307 on top of each pillar 330. Some of the methods for forming the strained silicon layer 300 have been discussed previously.

A channel region 310 is formed between the storage regions 303 and 304. Additionally, as in the planar embodiment of FIG. 1, a virtual source/drain region 320 is formed by an over-erase operation leaving the floating gate storage regions 303 and 304 with an absence of electrons (i.e., in a positive charge state). However, in the vertical split gate embodiment, the virtual source/drain region 320 and channel region 310 are two-dimensional in that they wrap around the corners of the substrate pedestal 330.

The operation of the vertical split gate layer transistor embodiment of FIG. 3 is substantially similar to the operations described above for the planar and planar split gate embodiments. A drain bias is applied to one of the source/drain regions 301 or 302 that causes the channel region 310 nearest the drain to pinch off 320 further away from the drain 301 than normal. Hot electrons accelerated in the narrow region 320 near the drain 301 become ballistic and are directly injected onto a storage region 303. The embodiment of FIG. 3 is also symmetrical and can be operated in either direction such that the storage of two bits is possible when operated in a virtual ground array.

Ballistic direct injection is easiest to achieve in a device structure where part of the channel is vertical as illustrated in the embodiment of FIG. 3. Lower write current and times are used since the geometry is conducive to hot electrons being accelerated by the electric fields. Hot electrons coming off of the pinched off end of the channel can be injected onto the floating gate storage regions without undergoing any collisions with the atoms in the lattice.

In each of the above-described embodiments, the strained silicon layer is formed on the relaxed $Si_xGe_{1-x}$ layer employing UHVCVD, ion implantation, micromechanical strain, or mechanical strain. Alternate embodiments may use other methods. The substrates or bodies below the $Si_xGe_{1-x}$ layer may be a silicon substrate or an insulator in a silicon-on-insulator structure.

In one embodiment, a substrate or well voltage, $V_{sub}$, can be used to assist during a program operation. The substrate bias enables the storage regions to store injected electrons in excess of those that would be stored without the substrate bias. Without the bias, the programming process is self-limiting in that when enough electrons have been collected on a storage region, that region tends to repel any further electrons. The substrate bias results in a significant negative charge to be written to the storage region. The substrate bias is not required for proper operation of the embodiments of the present invention.

In one embodiment, the substrate bias is a negative voltage in a range of −1V to −2V. Alternate embodiments use other voltages or voltage ranges.

The gate insulators of the above-described embodiments form the barrier for the electron's silicon transistor channel. The gate insulator can be reduced to improve the efficiency of the ballistic injection by using any one of a variety of higher dielectric constant (high-k) gate insulators with an electron affinity higher than that of silicon oxide (i.e., 0.9 eV). Higher dielectric constant insulators can also be used with metal floating gates. This reduces the barrier, $\Phi$, that electrons have to overcome for ballistic injection. A reduced barrier allows programming at even lower voltages with greater efficiency and lower currents.

The simplest nanolaminates with high-k dielectrics are oxide-high-k dielectric composites. Since silicon dioxide has a low electron affinity and high conduction band offset with respect to the conduction band of silicon (3.2 eV), these nanolaminates have a high barrier, $\Phi$, between the high-k dielectric and the oxide.

Embodiments of oxide-high-k dielectric composites of the present invention can include: oxide-$HfO_2$ (where the Hf is oxidized to form the $HfO_2$), oxide-$ZrO_2$ (where the Zr is oxidized to form the $ZrO_2$), oxide-$Al_2O_3$ (where the Al is oxidized to form the $Al_2O_3$), oxide-$La_2O_3$, oxide-$LaAlO_3$, oxide-$HfAlO_3$, oxide-$Y_2O_3$, oxide-$Gd_2O$, oxide-$Ta_2O_5$, oxide-$TiO_2$, oxide-ALD $PrO_3$, oxide-$CrTiO_3$, and oxide-YSiO. Alternate embodiments may include other dielectric materials.

Figure 4:
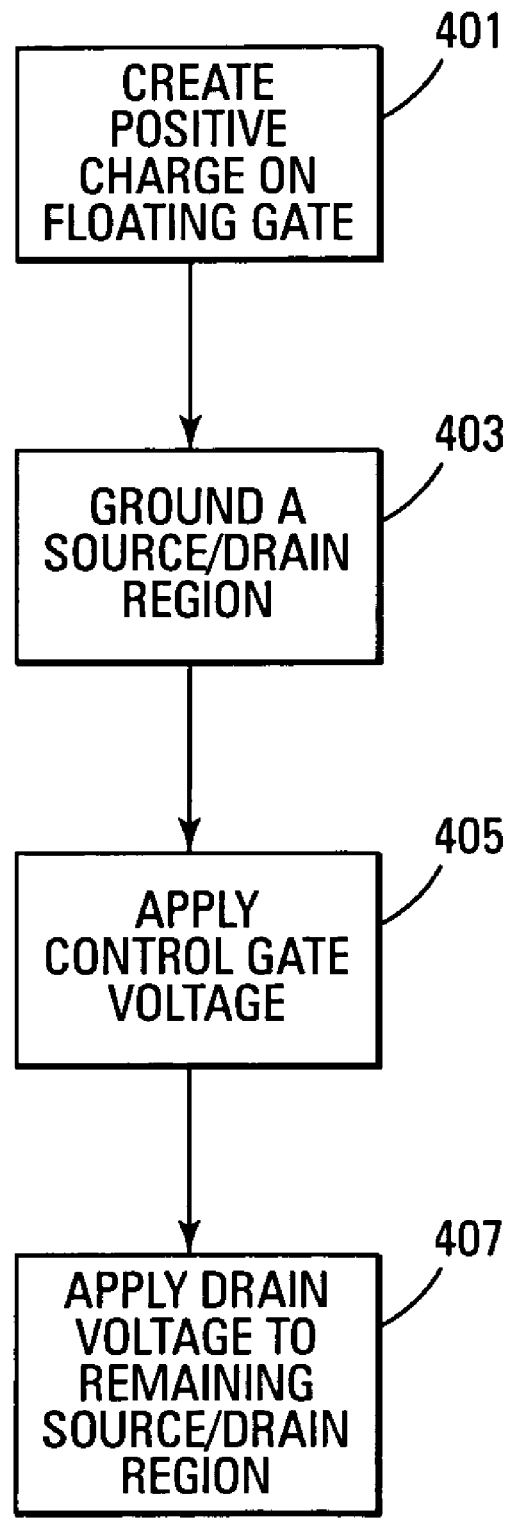
FIG. 4 shows a flowchart of one embodiment of the present invention for programming the flash memory cell with ballistic direct injection.

As illustrated in FIG. 4, one embodiment for a method for programming a flash memory cell occurs in flash memory cell comprising a strained silicon layer over a silicon-germanium layer with an ultra-short channel (i.e., <50 nm) in the strained silicon layer. A positive charge is created on the floating gate 401. This may be accomplished by over-erasing the cell in a split gate structure.

One of the source/drain regions is grounded 403 and a gate voltage is applied to the control gate 405. A voltage is applied to the remaining source/drain region 407 such that ballistic direct injection occurs in a virtual source/drain region of the channel adjacent a section of the floating gate. In one embodiment, a substrate bias is applied to the substrate.

Figure 5:
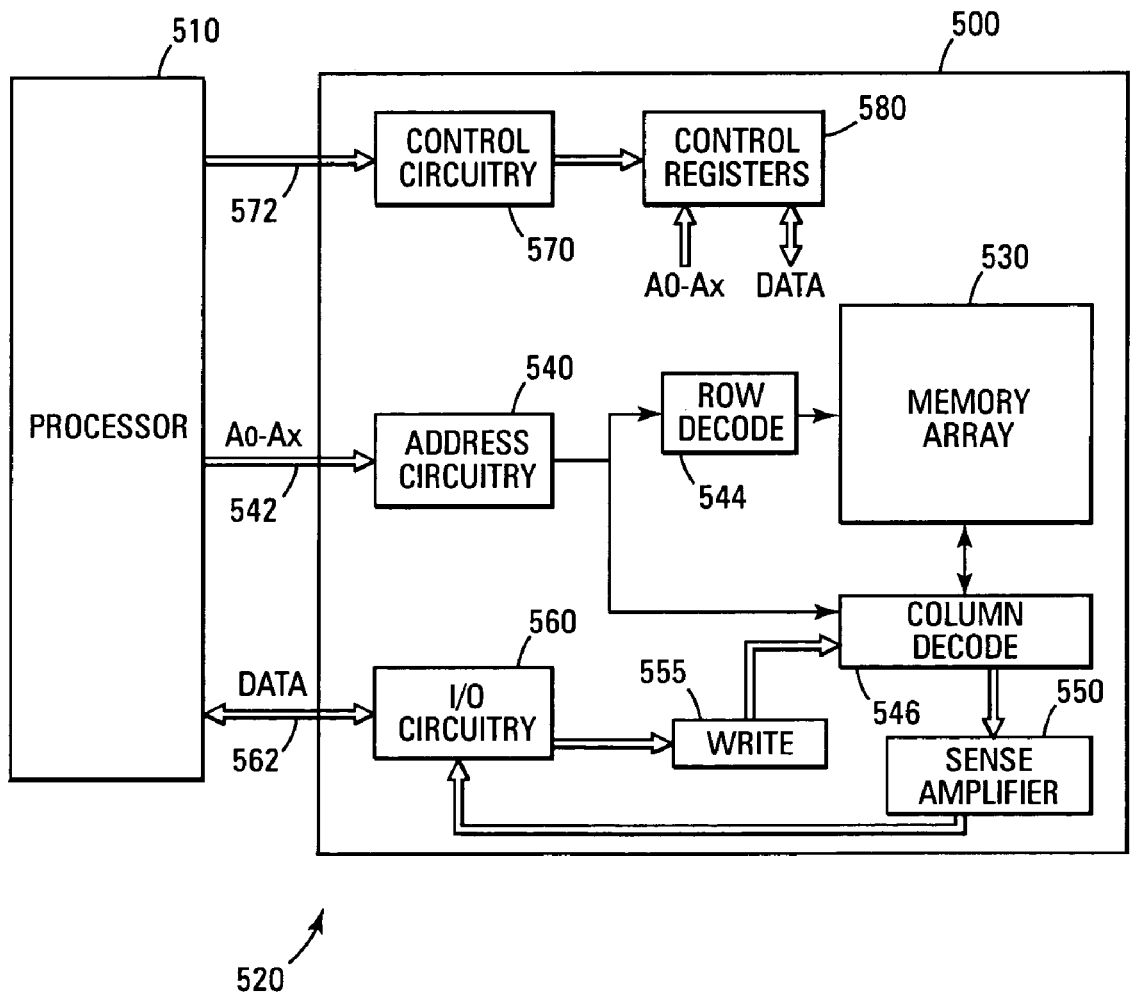
FIG. 5 shows a block diagram of an electronic system of the present invention.

FIG. 5 illustrates a functional block diagram of a memory device 500 that can incorporate the flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 that can be NROM flash memory cells. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier/buffer circuitry 550. The sense amplifier/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

The flash memory device illustrated in FIG. 5 has been simplified to facilitate a basic understanding of the features of the memory and is for purposes of illustration only. A more detailed understanding of internal circuitry and functions of flash memories are known to those skilled in the art.

Alternate embodiments may include the flash memory cell of the present invention in other types of electronic systems.

CONCLUSION

In summary, a flash memory device uses a combination of a very short channel in a strained silicon layer to accelerate electrons near a drain region during a write operation. Using the ballistic direct injection, electrons can be accelerated over a short distance and easily overcome the silicon-oxide interface potential barrier and be injected onto the floating gate layer. A negative substrate bias may be used to enhance the write operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory cell comprising:
   a silicon-germanium layer comprising a pair of source/drain regions;
   a strained silicon layer formed over the silicon-germanium layer, the pair of source/drain regions being linked by a channel region in the strained silicon layer;
   a floating gate layer formed over the channel, a first charge storage region of the floating gate layer establishes a virtual source/drain region in the channel, the virtual source/drain region having a lower threshold voltage than a remaining portion of the channel wherein the virtual source/drain region is established in response to an absence of electrons on the floating gate layer caused by an over-erased condition; and
   a control gate formed over the floating gate layer.

2. The cell of claim 1 wherein at least a portion of the channel region is in a vertical configuration.

3. The cell of claim 1 wherein the channel is in a planar configuration.

4. The cell of claim 1 and further including a substrate bias connection that is capable of applying a bias to the substrate.

5. The cell of claim 4 wherein the bias is in a range of −1V to −2V.

6. The cell of claim 2 wherein the vertical channel region configuration is two-dimensional.

7. The cell of claim 1 wherein the substrate is a p-type silicon material and the source/drain regions are an n-type silicon material.

8. The cell of claim 1 wherein the floating gate layer is separated from the strained silicon layer by a first oxide dielectric material and from the control gate by a second oxide dielectric material.

9. The cell of claim 1 wherein the strained silicon layer is formed by one of ultra-high vacuum chemical vapor deposition, ion implantation, micromechanical strain, or mechanical strain.

10. The cell of claim 1 wherein the floating gate layer is a metal floating gate.

11. The cell of claim 1 wherein the floating gate layer has a dielectric constant greater than that of silicon oxide.

12. The cell of claim 1 wherein the floating gate layer is part of a composite gate dielectric layer that is a composite oxide-high-k dielectric gate insulator wherein the high-k dielectric is a charge trapping layer.

13. The cell of claim 12 wherein the gate dielectric is a composite oxide-nitride nanolaminate gate insulator.

14. The cell of claim 12 wherein the gate dielectric is comprised of one of the following structures: oxide-$HfO_2$, oxide-$ZrO_2$, oxide-$Al_2O_3$, oxide-$La_2O_3$, oxide-$LaAlO_3$, oxide-$HfAlO_3$, oxide-$Y_2O_3$, oxide-$Gd_2O$, oxide-$Ta_2O_5$, oxide-$TiO_2$, oxide-$Pr_2O_3$, oxide-$CrTiO_3$, or oxide-$YSiO$.

15. A flash memory cell comprising:
   a silicon-germanium layer comprising a pair of source/drain regions;
   a strained silicon layer formed over the silicon-germanium layer, the pair of source/drain regions being linked by a channel in the strained silicon layer;
   a split gate insulator layer comprising a pair of charge storage regions, a first charge storage region establishes a virtual source/drain region in the channel, the virtual source/drain region having a lower threshold voltage than a remaining portion of the channel wherein the virtual source/drain region is established in response to an absence of electrons on the floating gate layer caused by an over-erased condition; and
   a control gate formed over the gate insulator layer and comprising a depression formed between the pair of charge storage regions such that the depression electrically isolates the charge storage regions.

16. The cell of claim 15 wherein the virtual source/drain region is established in response to a drain voltage being applied to a first source/drain region adjacent the virtual source/drain region.

17. The cell of claim 15 wherein the split gate insulator layer is comprised of one of the group of: silicon dioxide ($SiO_2$) formed by wet oxidation, silicon oxynitride (SON), silicon rich oxide (SRO), silicon rich aluminum oxide ($Al_2O_3$), silicon rich aluminum oxide insulators, silicon oxide insulators with inclusions of silicon carbide, or silicon oxycarbide insulators.

18. The cell of claim 15 wherein the split gate insulator layer is comprised of a composite layer selected from a group of: an oxide-nitride composite layer, an oxide-aluminum oxide ($Al_2O_3$) composite layer, or an oxide-silicon oxycarbide composite layer.

19. The cell of claim 15 wherein the gate insulator is comprised of one of a composite layer or a non-stoichiometric single layer of two or more materials selected from a group of silicon (Si), titanium (Ti), or tantalum (Ta).

20. The cell of claim 15 and further including an insulator layer under the silicon-germanium layer to form a silicon-on-insulator structure.

21. The cell of claim 15 wherein the virtual source/drain region is established in response to a positive charge on the first charge storage region.

22. The cell of claim 15 wherein the silicon-germanium layer is formed on a silicon substrate.

23. The cell of claim 15 wherein the strained silicon layer is formed by one of ultra-high vacuum chemical vapor deposition, ion implantation, micromechanical strain, or mechanical strain.

24. A flash memory cell comprising:
   a silicon-germanium layer having a pair of source/drain regions, each source/drain region located under a trench in the layer, the pair of source/drain regions being linked by a two-dimensional channel that follows a surface of a pillar formed between the trenches;
   a strained silicon layer formed over the silicon-germanium layer at the top of each pillar;

a pair of vertical charge storage regions that are separated by the pillar, a first charge storage region capable of establishing a virtual source/drain region in the channel adjacent to the first charge storage region, the virtual source/drain region having a lower threshold voltage than a remaining portion of the channel wherein the virtual source/drain region is established in response to an absence of electrons on the floating gate layer caused by an over-erased condition; and a control gate formed over the pair of vertical charge storage regions and the pillar.

25. The cell of claim 24 wherein a depression of the control gate is formed in the trench to separate a first flash memory cell from a second flash memory cell.

26. The cell of claim 24 and further including an insulator layer under the silicon-germanium layer to form a silicon-on-insulator structure.

27. The cell of claim 24 wherein the source/drain regions link a plurality of flash memory cells in a virtual ground array configuration.

28. The cell of claim 24 wherein the flash memory cell is a NAND flash memory cell.

29. The cell of claim 24 wherein the flash memory cell is a NOR flash memory cell.

30. The cell of claim 24 wherein control gate is separated from the pair of vertical charge storage regions and the pillar by an oxide dielectric material.

31. A flash memory cell array comprising:
a plurality of flash memory cells coupled together through wordlines and bitlines, each cell comprising:
a silicon-germanium layer comprising a pair of source/drain regions;
a strained silicon layer formed over the silicon-germanium layer, the pair of source/drain regions being linked by a channel in the strained silicon layer;
a floating gate layer formed over the channel, a first charge storage region of the floating gate layer establishes a virtual source/drain region in the channel, the virtual source/drain region having a lower threshold voltage than a remaining portion of the channel wherein the virtual source/drain region is established in response to an absence of electrons on the floating gate layer caused by an over-erased condition; and
a control gate formed over the floating gate layer.

32. The array of claim 31 wherein the plurality of flash memory cells are configured in a NAND-type architecture.

33. The array of claim 31 wherein the plurality of flash memory cells are configured in a NOR-type architecture.

34. An electronic system comprising:
a processor that generates memory control signals; and
a flash memory cell array coupled to the processor and comprising a plurality of flash memory cells coupled together through wordlines and bitlines, each cell comprising:
a silicon-germanium layer comprising a pair of source/drain regions;
a strained silicon layer formed over the silicon-germanium layer, the pair of source/drain regions being linked by a channel in the strained silicon layer;
a floating gate layer formed over the channel, a first charge storage region of the floating gate layer establishes a virtual source/drain region in the channel, the virtual source/drain region having a lower threshold voltage than a remaining portion of the channel wherein the virtual source/drain region is established in response to an absence of electrons on the floating gate layer caused by an over-erased condition; and
a control gate formed over the floating gate layer.

35. A method for writing to a flash memory cell comprising at least one charge storage region located between a substrate having two source/drain regions and a control gate, the two source/drain regions located in a silicon-germanium layer and linked by a channel a strained silicon layer on the silicon-germanium layer, the method comprising:
creating a positive charge on the floating gate by over-erasing the memory cell;
grounding a first source/drain region;
applying a gate voltage to the control gate; and
applying a drain voltage to the second source/drain region such that ballistic direct injection occurs in a virtual source/drain region of the channel adjacent a first charge storage region of the plurality of charge storage regions wherein the virtual source/drain region is established in response to an absence of electrons on the floating gate layer caused by the over-erasing.

36. The method of claim 35 and further including applying a substrate bias to the substrate.

37. The method of claim 36 wherein the substrate bias is a negative voltage.

38. The method of claim 35 wherein creating the positive charge includes over-erasing the flash memory cell.

39. A method for writing to a flash memory cell comprising a gate insulator layer having at least one charge storage region located between oxide dielectric layers, a silicon-germanium layer having two source/drain regions and a control gate over the gate insulator layer, the two source/drain regions linked by a channel in a strained silicon layer over the silicon-germanium layer, the method comprising:
creating a positive charge on the floating gate by over-erasing the memory cell thus creating a virtual source/drain region;
grounding a first source/drain region;
applying a gate voltage to the control gate; and
applying a drain voltage to the second source/drain region such that the channel is pinched off a predetermined distance from the second source/drain region and adjacent to a first charge storage region of the at least one charge storage region.

* * * * *